United States Patent

Hudson et al.

[11] Patent Number: 5,830,806
[45] Date of Patent: Nov. 3, 1998

[54] WAFER BACKING MEMBER FOR MECHANICAL AND CHEMICAL-MECHANICAL PLANARIZATION OF SUBSTRATES

[75] Inventors: Guy F. Hudson; Karl M. Robinson, both of Boise, Id.

[73] Assignee: Micron Technology, Inc., Boise, Id.

[21] Appl. No.: 730,869

[22] Filed: Oct. 18, 1996

[51] Int. Cl.$^6$ .................................................. H01L 21/302
[52] U.S. Cl. ............................ 438/690; 438/692; 216/88; 156/345 LP; 451/41; 451/287; 451/398
[58] Field of Search ............................... 156/345; 216/88; 438/690, 692; 451/288, 398, 287, 41

[56] References Cited

U.S. PATENT DOCUMENTS

| | | | |
|---|---|---|---|
| 4,132,037 | 1/1979 | Bonora | 51/131 C |
| 5,101,602 | 4/1992 | Hashimoto | 51/216 LP |
| 5,232,875 | 8/1993 | Tuttle et al. | 437/225 |
| 5,398,459 | 3/1995 | Okumura et al. | 451/41 |
| 5,527,209 | 6/1996 | Volodarsky et al. | 451/388 |
| 5,573,448 | 11/1996 | Nakazima et al. | 451/41 |
| 5,584,746 | 12/1996 | Tanaka et al. | 145/41 |
| 5,593,537 | 1/1997 | Cote et al. | 156/636.1 |
| 5,624,299 | 4/1997 | Shendon | 451/28 |

Primary Examiner—R. Bruce Breneman
Assistant Examiner—Anita Alanko
Attorney, Agent, or Firm—Seed & Berry, LLP

[57] ABSTRACT

A wafer backing member for use in a wafer carrier of a chemical-mechanical planarization machine between the wafer carrier and the backside of a semiconductor wafer or other substrate. In one embodiment, the backing member has a body including a first layer to abut against the backside of the wafer and a second layer to abut against the wafer carrier. The first layer is substantially rigid or substantially non-compressible to preferably inhibit flexing of the wafer, and the second layer is resiliently compressible to cushion the backside of the wafer. In operation, the compressible second layer reduces the differences in pressure from one area of the wafer to another and the rigid first layer distributes the forces more uniformly across the backside of the wafer. As a result, the wafer backing member substantially reduces the center-to-edge difference in polishing rates to more uniformly planarize the front face of the wafer.

50 Claims, 2 Drawing Sheets

WAFER BACKING MEMBER FOR MECHANICAL AND CHEMICAL-MECHANICAL PLANARIZATION OF SUBSTRATES

TECHNICAL FIELD

The present invention relates to mechanical and chemical-mechanical planarization of substrates, and more particularly to a wafer backing member for use in a wafer carrier of a chemical-mechanical planarization machine between the wafer carrier and a backside of a semiconductor wafer.

BACKGROUND OF THE INVENTION

Chemical-mechanical planarization ("CMP") processes remove material from the surface of a semiconductor wafer in the production of integrated circuits. FIG. 1 schematically illustrates a CMP machine 10 with a platen 20, a wafer carrier 30, a polishing pad 40, and a planarizing liquid 44 on the polishing pad 40. The polishing pad 40 may be a conventional polishing pad made from a continuous phase matrix material (e.g., polyurethane), or it may be a new generation fixed-abrasive polishing pad made from abrasive particles fixedly dispersed in a suspension medium. The planarizing liquid 44 may be a conventional CMP slurry with abrasive particles and chemicals that remove material from the wafer, or the planarizing liquid 44 may be a planarizing solution without abrasive particles. In most CMP applications, conventional CMP slurries with abrasive particles are used on conventional polishing pads, and planarizing solutions without abrasive particles are used on fixed-abrasive polishing pads.

The CMP machine 10 also has an under pad 25 attached to an upper surface 22 of the platen 20 and the lower surface of the polishing pad 40. A drive assembly 26 rotates the platen 20 (indicated by arrow A), or it reciprocates the platen 20 back and forth (indicated by arrow B). Since the polishing pad 40 is attached to the under pad 25, the polishing pad 40 moves with the platen 20.

The wafer carrier 30 has a lower surface 32 to which a wafer 12 may be attached, or the wafer 12 may be attached to a resilient pad 34 positioned between the wafer 12 and the lower surface 32. The wafer carrier 30 may be a weighted, free-floating wafer carrier; or an actuator assembly 36 may be attached to the wafer carrier to impart axial and/or rotational motion (indicated by arrows C and D, respectively).

To planarize the wafer 12 with the CMP machine 10, the wafer carrier 30 presses the wafer 12 face-downward against a planarizing surface 42 of the polishing pad 40. While the face of the wafer 12 presses against the polishing pad 40, at least one of the platen 20 or the wafer carrier 30 moves relative to the other to move the wafer 12 across the planarizing surface 42. As the face of the wafer 12 moves across the planarizing surface 42, the polishing pad 40 and the planarizing liquid 44 continually remove material from the face of the wafer 12.

CMP processes must consistently and accurately produce a uniform, planar surface on the wafer to enable precise circuit and device patterns to be formed with photolithography techniques. As the density of integrated circuits increases, it is often necessary to accurately focus the critical dimensions of the photo-patterns to within a tolerance of approximately 0.1 $\mu$m. Focusing photo-patterns of such small tolerances, however, is difficult when the planarized surface of the wafer is not uniformly planar. Thus, CMP processes must create a highly uniform, planar surface.

One problem with CMP processes is that the surface of the wafer may not be uniformly planar because the rate at which the thickness of the wafer decreases (the "polishing rate") is often not uniform across the face of the wafer. The polishing rate depends, in part, on the pressure between the pad and the wafer. Although it is desirable to have a uniform pressure across the face of the wafer, several factors often cause the pressure between the pad and the wafer to vary across the face of the wafer. One such factor is that the wafer is generally flexible and it may deform during planarization. The deformation of the wafer typically results in random non-uniformities in pressure across the wafer. Another factor that causes non-uniformities in the pressure across the face of the wafer is that the wafer carrier may tilt with respect to the planarizing surface of the polishing pad during planarization. Such tilting of the wafer carrier is generally known as the "gimbal effect," and it causes the pressure to be greater at one point on the perimeter of the wafer than at the center of the wafer. Therefore, to reduce non-uniformities in the polishing rate across the surface of the wafer, it is desirable to reduce non-uniformities in pressure across the wafer caused by deformation of the wafer and the gimbal effect.

Several wafer backing devices have been developed to increase the uniformity of the polishing rate across the surface of a wafer. As described above with respect to the resilient pad 34 of FIG. 1, wafer backing devices are positioned between the wafer 12 and the wafer carrier 30. One existing wafer backing device is a rigid backing member that substantially prevents a wafer from flexing during planarization. Conventional rigid wafer backing members accordingly reduce local deformations across the face of a wafer that could produce random non-uniform polishing rates. However, experiments show that rigid backing members actually exaggerate the difference in polishing rates between the perimeter and the center of a wafer. Therefore, rigid backing members may not provide a sufficiently uniformly planar surface on a wafer.

Another wafer backing device for enhancing the uniformity of a wafer is a compressible backing member, such as the resilient pad 34 of FIG. 1. Compressible wafer backing members reduce the disparity between the polishing rates at the center and the perimeter of the wafer. Compressible backing members, however, do not prevent the wafer from flexing or deforming during planarization. As a result, when compressible backing members are used in CMP processes, random non-uniformities in the polishing rate may occur across the face of the wafer. Another problem with compressible backing members is that they are not well suited to enable independent motion between the wafer and the wafer carrier in planarizing machines in which the wafer moves about an off-center axis within the wafer carrier. To enable such independent motion between the wafer and the wafer carrier, the wafer carrier is larger than the wafer and the wafer backing member allows the wafer to move within the wafer carrier (see U.S. Pat. No. 5,398,459). Compressible wafer backing members generally inhibit independent movement of the wafer in the wafer carrier because they are generally made from high friction materials that inhibit relative movement between the wafer and the wafer carrier. Therefore, compressible backing members not only allow the wafer to deform, but they also are not well suited for use with CMP processes that allow the wafer to move independently from the wafer carrier.

In light of the problems with rigid and compressible wafer backing members, it would be desirable to develop a device that reduces non-uniformities in the polishing rate across the face of the wafer and is well suited to enable independent motion between the wafer and the wafer carrier.

SUMMARY OF THE INVENTION

The present invention is a wafer backing member for use in a wafer carrier of a chemical-mechanical planarization machine between the wafer carrier and the backside of a semiconductor wafer or other substrate. In one embodiment, the backing member has a body including a first layer to abut against the backside of the wafer and a second layer to abut against the wafer carrier. The first layer is substantially rigid or non-compressible to preferably inhibit local flexing of the wafer, and the second layer is resiliently compressible to cushion the backside of the wafer. In operation, the compressible second layer reduces the differences in pressure from one area of the wafer to another, and the rigid first layer distributes the forces more uniformly across the backside of the wafer. As a result, the wafer backing member substantially reduces differences in polishing rates across the wafer to more uniformly planarize the front face of the wafer.

The first layer of the body is preferably made from a hard, low friction material such as an epoxy fiberglass or PTFE. The second layer of the body is preferably made from a resilient foam or porous material that is substantially compressible. The first and second layers of the body are preferably different materials, but the body may be made from a single material that is treated to impart the desired rigidity and compressibility to the first and second layers, respectively.

DETAILED DESCRIPTION OF THE INVENTION

Figure 2:
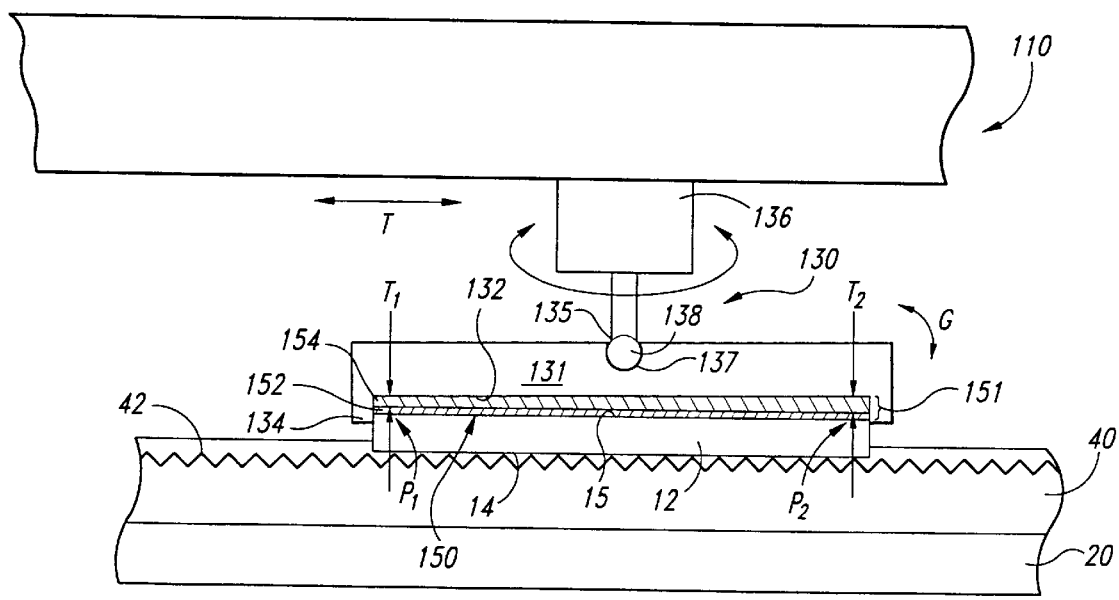
FIG. 2 is a partial schematic cross-sectional view of a wafer backing member and a wafer carrier in accordance with the invention.
Figure 3:
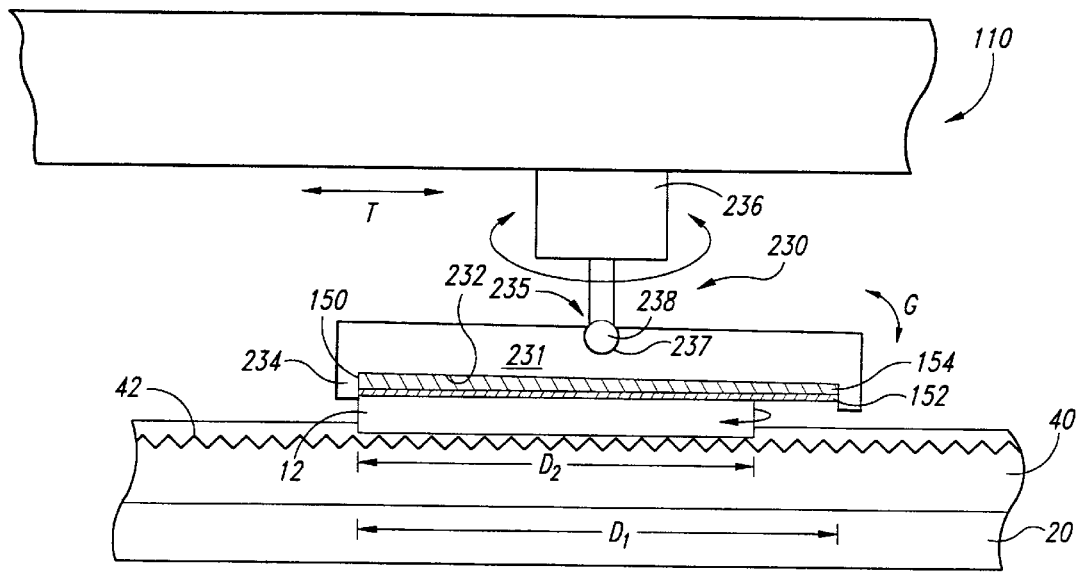
FIG. 3 is a partial schematic cross-sectional view of an embodiment of a wafer backing member and another wafer carrier in accordance with the invention.

The present invention is a chemical-mechanical planarization machine with a wafer backing member that reduces non-uniformities in the polishing rate across the wafer or other type of substrate. An important aspect of an embodiment of the invention is that the wafer backing member has a body with a substantially rigid or substantially non-compressible first layer abutting the wafer, and a compressible second layer between the wafer carrier and the first layer. The first layer preferably inhibits the wafer from deforming to distribute forces across the backside of the wafer, and the second layer preferably cushions the wafer to reduce differences in pressure across the backside of the wafer. FIGS. 2 and 3, in which like reference numbers refer to like parts, illustrate a wafer backing members and wafer carriers in accordance with the invention.

Figure 1:
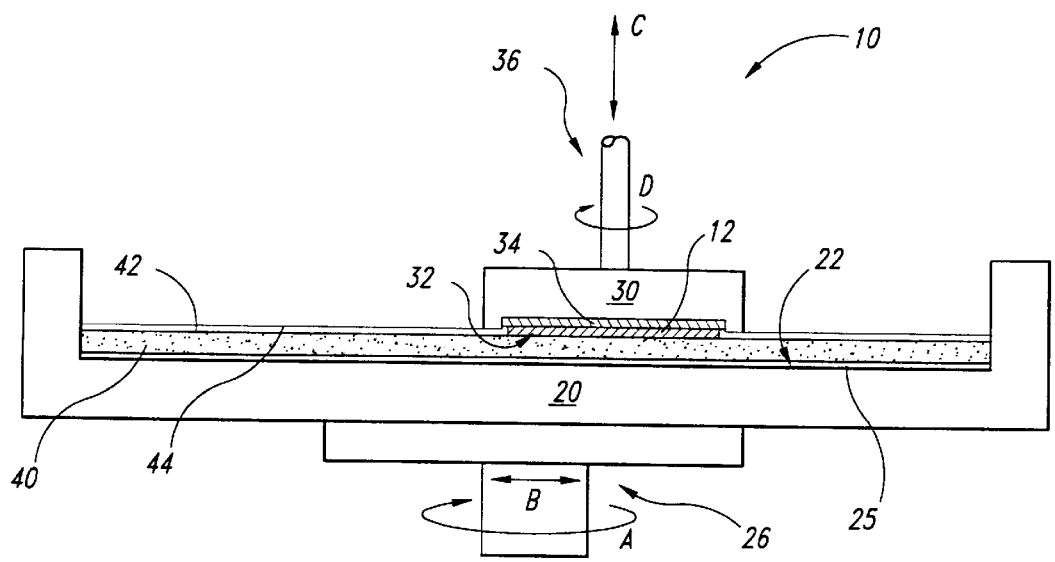
FIG. 1 is a schematic cross-sectional view of a chemical-mechanical planarization machine in accordance with the prior art.

FIG. 2 is a partial schematic cross-sectional view of a preferred embodiment of a CMP machine 110 and a wafer carrier 130 in accordance with the invention. The wafer carrier 130 has a wafer holder 131 with a lower surface 132 and a retaining rim 134 extending downwardly from the perimeter of the lower surface 132. The lower surface 132 and the retaining rim 134 define a mounting cavity in which a wafer 12 is mounted to the wafer holder 131. The wafer holder 131 is attached to an actuator 136 by a gimbal joint 135 in which a ball 138 at the end of the actuator 136 is rotatably connected to a socket 137 in the top of the wafer holder 131. As discussed above with respect to the wafer carrier 30 of FIG. 1, the actuator 136 rotates and/or translates the wafer carrier 130 with respect to a polishing pad 40 and a platen 20.

The CMP machine 110 also has a wafer backing member 150 in the mounting cavity of the wafer holder 131. The wafer backing member 150 preferably has a body 151 with a first layer 152 and a second layer 154. The first layer 152 may be a first stratum or lower section of the body 151 that abuts a backside 15 of the wafer 12 and is substantially rigid or non-compressible to preferably inhibit flexing of the wafer 12. The second layer 154 may be a second stratum or upper section of the body 151 that is positioned between the first layer 152 of the body 151 and the lower surface 132 of the wafer carrier 130. The second layer 154 is compressible to cushion the backside 15 of the wafer 12.

In one embodiment of the invention, the body 151 of the backing member 150 is a single piece of material. The backing member 150 may be a substantially compressible material in which the first layer 152 is treated to reduce the compressibility of the material in the first layer 152 and form a substantially rigid layer or substantially non-compressible layer. Conversely, the wafer backing member 150 may be a substantially rigid or non-compressible material in which the second layer 154 is treated to reduce the rigidity or increase the compressibility of the material in the second layer 154 and form a substantially compressible layer. In still another embodiment, the wafer backing member 150 may be a single piece of material in which the material of the first layer 152 is treated to form a substantially rigid layer and the material of the second layer 154 is treated to form a substantially compressible layer.

In a preferred embodiment of the invention, the first and second layers 152 and 154 of the wafer backing member 150 are made of different materials. The first layer 152 is preferably a hard material, and more preferably the first layer 152 is a low-friction, hard material. Suitable materials for the first layer 152 include, but are not limited to, acetal (Delrin® manufactured by E. I. Dupont de Nemours Company), polyethylene terephthalate (Mylar® manufactured by E. E. Dupont de Nemours Company), high-density polyethylene (e.g., molecular weight of at least 200,000), epoxy fiberglass and PTFE films. One suitable epoxy fiberglass film is the FR4 Epoxy Fiberglass distributed by Rodel Corporation of Newark, Del., and a suitable PTFE film is Teflon® manufactured by E. I. Dupont de Nemours Company of Wilmington, Del. The epoxy fiberglass films are preferably between 0.001 and 0.01 inches in thickness, and the PTFE layers are preferably between 0.0005 and 0.005 inches in thickness. The second layer 154 of the body 151 is preferably an open-cell foam, a closed-cell foam, or a porometric material. One suitable material for the second layer 154 is the DF200 porometric material manufactured by Rodel Corporation of Newark, Del. The second layer 154 is generally thicker than the first layer 152, and more specifically the second layer 154 preferably has a thickness of between approximately 0.020 and 0.100 inches.

FIG. 2 also illustrates the operation of the wafer backing member 150. The wafer carrier 130 presses the wafer 12 against a polishing pad 40, and at least one of the wafer carrier 130 or the platen 20 moves with respect to the other to move the wafer 12 across the planarizing surface 42 of the polishing pad 40. The wafer holder 131 often pivots about the gimbal joint 135 (indicated by arrow G) causing the force against the wafer 12 at a point $P_1$ on one side of the wafer holder 131 to be greater than that at a point $P_2$ on the opposite side of the wafer holder 131. In response to the different magnitudes of forces at points $P_1$ and $P_2$, the second layer 154 of the wafer backing member 150 compresses to a thickness $T_1$ above point $P_1$ and expands to a thickness $T_2$ above point $P_2$. The second layer 154 accordingly reduces the differences in the magnitudes of the forces at points $P_1$ and $P_2$ to transmit a more uniform force profile to the first layer 152 of the backing member 150. Additionally, since the first layer 152 is substantially rigid, it distributes the forces from the second layer 154 across the backside 15 of the wafer 12.

An advantage of the present invention is that it increases the uniformity of the wafer by reducing the center-to-edge difference in polishing rates caused by the gimbal effect. The combination of the rigid first layer 152 adjacent to the backside 15 of the wafer 12 and the compressible second layer 154 between the wafer holder 131 and the first layer 152 reduces differences in pressures between the polishing pad 40 and the wafer 12 across the face of the wafer 12. Therefore, the wafer backing member 150 results in a more uniformly planar surface 14 on the wafer 12.

FIG. 3 is a partial schematic cross-sectional view of another wafer carrier 230 for CMP in which the wafer 12 moves independently within the wafer carrier 230. The wafer carrier 230 has a wafer holder 231 with a lower surface 232 and a retaining rim 234 extending downwardly from the perimeter of the lower surface 232. The retaining rim 234 and the lower surface 232 define a cavity with a diameter $D_1$ greater than a diameter $D_2$ of the wafer 12. The wafer 12 accordingly moves independently within the cavity defined by the retaining rim 234 and the lower surface 232. The wafer backing member 150 may be the same as that discussed above with respect to FIG. 2, and thus it has a first substantially rigid layer 152 and a second compressible layer 154. In this embodiment, the first layer 152 of the wafer backing member 150 is preferably a low-friction material that allows the wafer 12 to readily slide under the first layer 152 and prevents the wafer 12 from flexing. The FR4 Epoxy Fiberglass distributed by Rodel Corporation of Newark, Del., or the Teflon® PTFE manufactured by E. I. Dupont de Nemours, of Wilmington, Del., are suitable hard, low-friction materials for the first layer 152. Other suitable materials include acetal, high-density polyethylene, and polyethylene terephthalate.

The wafer backing member 150 in the wafer carrier 230 works in the same manner as discussed above with respect to the wafer carrier 130 of FIG. 2. Accordingly, the wafer carrier 230 with the wafer backing member 150 of the invention has the same advantages as discussed above, and it is also well suited for working in CMP machines and processes that require independent motion between the wafer and the wafer carrier.

Figure 4:
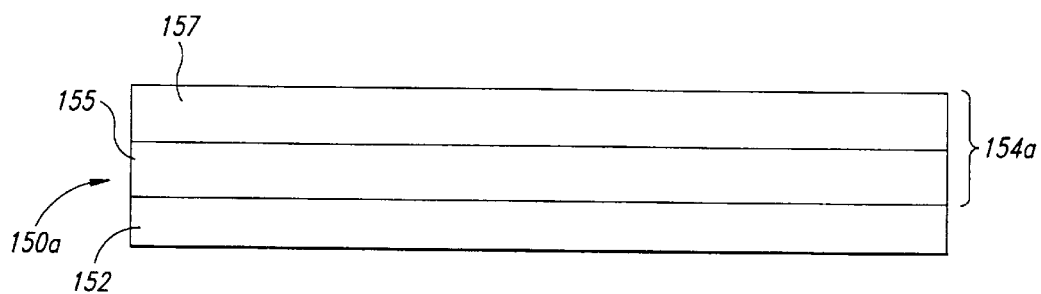
FIG. 4 is a schematic cross-sectional view of another embodiment of a wafer backing member in accordance with the invention.

FIG. 4 is a schematic cross-sectional view of another embodiment of a backing member 150($a$) in accordance with the invention. As discussed above with respect to the backing member 150 shown in FIGS. 2 and 3, the backing member 150($a$) has a substantially non-compressible first layer 152 to abut the backside of the wafer (not shown) and a compressible second layer 154($a$) positioned between the first layer 152 and the wafer carrier (not shown). The second layer 154($a$), however, is a multiple-level layer with a lower lever 155 and an upper lever 157. The lower and upper levels 155 and 157 of the second layer 154($a$) have different compressibilities such that the lower level 155 is either more or less compressible than the upper level 157. In one embodiment of the wafer backing member 150($a$), the first layer 152 is made from the FR4 epoxy fiberglass film, the lower level 155 of the second layer 154($a$) is made from the DF200 porometric material, and the upper level 157 of the second layer 154($a$) is made from a closed cell elastomer. Accordingly, wafer backing members in accordance with the present invention may have more than two layers or levels of materials with different compressibilities.

From the foregoing it will be appreciated that, although specific embodiments of the invention have been described herein for purposes of illustration, various modifications may be made without deviating from the spirit and scope of the invention. Also, although the various embodiments of the inventive wafer backing member are described as being used for planarizing semiconductor wafers, it will be understood that they may be used to polish other types of substrates, such as baseplates for field emission displays. Accordingly, the invention is not limited except as by the appended claims.

What is claimed is:

1. A wafer backing member for use in a wafer carrier of a chemical-mechanical planarization machine between the wafer carrier and a backside of a wafer substrate, the wafer backing member comprising a body having a first layer to abut against the backside of the wafer and a second layer to abut against the wafer carrier, the first layer being substantially non-compressible and the second layer being resiliently compressible.

2. The wafer backing member of claim 1 wherein the body comprises a single piece of compressible material, the first layer being a treated portion of the compressible material to reduce the compressibility of the material in the first layer and form a substantially non-compressible layer.

3. The wafer backing member of claim 1 wherein the body comprises a single piece of substantially non-compressible material, the second layer being a treated portion of the substantially non-compressible material to increase the compressibility of the material in the second layer and form a compressible layer.

4. The wafer backing member of claim 1 wherein the body comprises a single piece of material, the first layer being a treated portion of the material to reduce compressibility of the material in the first layer and form a substantially non-compressible layer, and the second layer being a treated portion of the material to increase the compressibility of the material in the second layer and form a compressible layer.

5. The wafer backing member of claim 1 wherein the body comprises a plurality of materials, the first layer being a first material and the second layer being a second material different than the first material.

6. The wafer backing member of claim 5 wherein the first layer comprises a low friction material.

7. The wafer backing member of claim 5 wherein the first layer comprises an epoxy fiberglass film and the second layer comprises an open-cell foam.

8. The wafer backing member of claim 5 wherein the first layer comprises from an epoxy fiberglass and the second layer is made from a closed-cell foam.

9. The wafer backing member of claim 5 wherein the first layer is made from an epoxy fiberglass and the second layer is made from a porometric material.

10. The wafer backing member of claim 8 wherein the first layer is between approximately 0.001 and 0.010 inches in thickness.

11. The wafer backing member of claim 5 wherein the first layer comprises PTFE and the second layer comprises a closed-cell foam.

12. The wafer backing member of claim 5 wherein the first layer comprises PTFE and the second layer comprises an open-cell foam.

13. The wafer backing member of claim 12 wherein the PTFE is between approximately 0.0005 and 0.005 inches in thickness.

14. The wafer backing member of claim 5 wherein the second layer comprises a polyethylene having a molecular weight of at least 150,000.

15. The wafer backing member of claim 5 wherein the second layer comprises a polyethylene terephthalate.

16. The wafer backing member of claim 5 wherein the second layer comprises acetal.

17. The wafer backing member of claim 1 wherein the second layer comprises an upper level and a lower level, the upper and lower levels having different compressibilities.

18. A wafer backing member for use in a wafer carrier of a chemical-mechanical planarization machine between the wafer carrier and a backside of a wafer substrate, the wafer backing member comprising a body having a first stratum with a first hardness to engage the backside of the wafer and a second stratum with a second hardness to engage the wafer carrier, the first hardness being greater than the second hardness.

19. The wafer backing member of claim 18 wherein the body comprises a single piece of material, the first stratum being a treated portion of the material to increase the hardness of the material in the first stratum and form a layer having the first hardness, and the second stratum being a treated portion of the material to reduce the hardness of the material in the second stratum and form a compressible layer.

20. The wafer backing member of claim 18 wherein the body comprises a plurality of materials, the first stratum being a first material and the second stratum being a second material different than the first material.

21. The wafer backing member of claim 20 wherein the first stratum comprises a low friction material.

22. The wafer backing member of claim 20 wherein the first stratum comprises an epoxy fiberglass film and the second stratum comprises an open-cell foam.

23. The wafer backing member of claim 20 wherein the first stratum comprises PTFE and the second stratum comprises an open-cell foam.

24. A wafer backing member for use in a wafer carrier of a chemical-mechanical planarization machine between the wafer carrier and a backside of a wafer substrate, the wafer backing member comprising a body having a lower section that engages the backside of the wafer and an upper section that engages the wafer carrier, the lower section being substantially rigid to inhibit deformation of the wafer and the upper section being resiliently deformable to allow displacement between the backside of the wafer and the wafer carrier.

25. The wafer backing member of claim 24 wherein the body comprises a single piece of material, the lower section being a treated portion of the material to reduce compressibility of the material in the lower section and form a substantially rigid layer, and the upper section being a treated portion of the material to reduce the rigidity of the material in the upper section and form a compressible layer.

26. The wafer backing member of claim 24 wherein the body comprises a plurality of materials, the lower section being a first material and the upper section being a second material different than the first material.

27. The wafer backing member of claim 26 wherein the lower section comprises a low friction material.

28. The wafer backing member of claim 26 wherein the lower section comprises an epoxy fiberglass film and the upper section comprises an open-cell foam.

29. The wafer backing member of claim 26 wherein the lower section comprises PTFE and the upper section comprises an open-cell foam.

30. A chemical-mechanical planarization machine, comprising:
a platen mounted to a support structure;
a polishing pad positioned on the platen;
a wafer carrier having a lower face with a perimeter and a retaining rim extending downward from the perimeter of the lower face, wherein the lower face and the retaining rim define a mounting cavity in which a wafer substrate may be mounted; and
a wafer backing member having a body including an upper section abutted against the lower face of the wafer carrier and a lower section to abut against a backside of the wafer, the lower section being substantially rigid to inhibit flexing of the wafer and the upper section being resiliently compressible to cushion the backside of the wafer.

31. The chemical-mechanical planarization machine of claim 30 wherein the wafer backing body comprises a single material.

32. The chemical-mechanical planarization machine of claim 30 wherein the wafer backing body comprises a plurality of materials.

33. The chemical-mechanical planarization machine of claim 30 wherein the retaining rim abuts the perimeter of the wafer to substantially prevent relative movement between the wafer and the wafer carrier, and wherein the upper section of the wafer backing member comprises an open-cell foam and the lower section of the wafer backing member comprises an epoxy fiberglass.

34. The chemical-mechanical planarization machine of claim 30 wherein the retaining rim is larger than a diameter of the wafer and the lower section of the wafer backing member comprises a low-friction material to allow relative movement between the wafer and the wafer carrier in the mounting cavity of the wafer carrier.

35. The chemical-mechanical planarization machine of claim 34 wherein the lower section of the backing member comprises PTFE.

36. The chemical-mechanical planarization machine of claim 34 wherein the lower section of the backing member comprises an epoxy fiberglass.

37. The chemical-mechanical planarization machine of claim 30 wherein the retaining rim is larger than a diameter of the wafer to allow precession of the wafer within the mounting cavity of the wafer carrier, and wherein the upper section of the wafer backing member comprises an open-cell foam and the lower section of the wafer backing member comprises an epoxy fiberglass.

38. A wafer carrier for use with a chemical-mechanical planarization machine, comprising:
a wafer holder having a lower face with a perimeter and a retaining rim projecting downwardly from the perimeter of the lower face, wherein the lower face and the retaining rim define a mounting cavity in which a semiconductor wafer may be mounted; and
a wafer backing member having a body including an upper section abutted against the lower face of the wafer carrier and a lower section to abut against a backside of the wafer, the lower section being substantially rigid to inhibit flexing of the wafer and the upper section being resiliently compressible to cushion the backside of the wafer.

39. The chemical-mechanical planarization machine of claim 38 wherein the wafer backing member comprises a single material.

40. The chemical-mechanical planarization machine of claim 38 wherein the wafer backing member comprises a plurality of materials.

41. The chemical-mechanical planarization machine of claim 38 wherein the retaining rim abuts the perimeter of the wafer to substantially prevent relative movement between the wafer and the wafer carrier, and wherein the upper section of the wafer backing member comprises an open-cell foam and the lower section of the wafer backing member comprises an epoxy fiberglass.

42. The chemical-mechanical planarization machine of claim 38 wherein the retaining rim is larger than a diameter of the wafer and the lower section of the wafer backing member comprises a low friction material to allow relative movement between the wafer and the wafer carrier in the mounting cavity of the wafer carrier.

43. The chemical-mechanical planarization machine of claim 42 wherein the lower section of the backing member comprises PTFE.

44. The chemical-mechanical planarization machine of claim 42 wherein the lower section of the backing member comprises an epoxy fiberglass.

45. A method of planarizing a semiconductor wafer, comprising the steps of:

providing a wafer carrier having a wafer holder and a wafer backing member positioned in the wafer holder, the wafer backing member having an upper section abutted against a lower face of the wafer holder and a lower section to abut against a backside of the wafer, the lower section being substantially rigid to inhibit flexing of the wafer and the upper section being resiliently compressible to cushion the backside of the wafer;

mounting the backside of the wafer to the lower section of the wafer backing member;

pressing the wafer against a polishing pad; and moving at least one of the wafer carrier and the polishing pad to impart relative motion therebetween as the wafer is pressed against the polishing pad.

46. The method of claim 45 wherein the pressing step further comprises cushioning displacement between the backside of the wafer and a lower face of the wafer carrier during the moving step.

47. The method of claim 45 wherein the pressing step further comprises inhibiting the wafer from deforming during the moving step.

48. The method of claim 45, further comprising:

inhibiting the wafer from deforming during the moving step; and cushioning displacement between the backside of the wafer and a lower face of the wafer carrier during the moving step.

49. A method for chemical-mechanical planarization of a semiconductor wafer, the method comprising the steps of:

pressing the wafer against a polishing pad;

moving at least one of the wafer and the polishing pad with respect to the other to impart relative motion therebetween as the wafer is pressed against the polishing pad;

inhibiting deformation of the wafer with a first substantially rigid layer abutting a backside of the wafer as the at least one of the wafer and the polishing pad moves with respect to the other; and cushioning displacement between the backside of the wafer and a lower face of a wafer carrier to which the wafer is mounted with a second compressible layer abutting the first layer as the at least one of the wafer and the polishing pad moves with respect to the other.

50. The method of claim 49 wherein the cushioning step comprises abutting the second compressible layer with the wafer carrier.

* * * * *